United States Patent
Hsu et al.

(10) Patent No.: US 11,817,420 B2
(45) Date of Patent: Nov. 14, 2023

(54) SYSTEMS AND METHODS FOR DIRECT BONDING IN SEMICONDUCTOR DIE MANUFACTURING

(71) Applicant: Micron Technology, Inc., Boise, ID (US)

(72) Inventors: Chia Jung Hsu, Taichung (TW); Eiichi Nakano, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 200 days.

(21) Appl. No.: 17/379,568

(22) Filed: Jul. 19, 2021

(65) Prior Publication Data

US 2023/0020037 A1   Jan. 19, 2023

(51) Int. Cl.
*H01L 23/00* (2006.01)
*H01L 25/065* (2023.01)

(52) U.S. Cl.
CPC .............. *H01L 24/80* (2013.01); *H01L 24/05* (2013.01); *H01L 25/0657* (2013.01); *H01L 2224/05647* (2013.01); *H01L 2224/8012* (2013.01); *H01L 2224/80948* (2013.01); *H01L 2225/06541* (2013.01)

(58) Field of Classification Search
CPC ............... H01L 24/80; H01L 25/0657; H01L 2224/08145; H01L 2224/08123; H01L 2224/08146
See application file for complete search history.

(56) References Cited

U.S. PATENT DOCUMENTS

| 7,294,217 | B2 * | 11/2007 | Beatson | H01L 24/05 228/110.1 |
| 2015/0364434 | A1 * | 12/2015 | Chen | H01L 24/03 257/773 |
| 2017/0062366 | A1 | 3/2017 | Enquist | |
| 2019/0221548 | A1 * | 7/2019 | Huang | H01L 24/00 |
| 2020/0051937 | A1 * | 2/2020 | Uzoh | H01L 24/03 |
| 2020/0075533 | A1 * | 3/2020 | Gao | H01L 24/74 |
| 2020/0105600 | A1 * | 4/2020 | Lu | H01L 25/0657 |
| 2020/0176420 | A1 | 6/2020 | Or-Bach et al. | |
| 2020/0258857 | A1 * | 8/2020 | Huo | H01L 25/50 |

(Continued)

FOREIGN PATENT DOCUMENTS

CN    113594135 A  * 11/2021  ......... H01L 23/3171

*Primary Examiner* — Mamadou L Diallo
(74) *Attorney, Agent, or Firm* — Perkins Coie LLP

(57) ABSTRACT

A stacked semiconductor device and systems and methods for producing the same are disclosed here. In some embodiments, the method includes aligning a first array of bond pads on an upper surface of a first semiconductor substrate with a second array of bond pads on a lower surface of a second semiconductor substrate. The method then includes annealing the stacked semiconductor device to bond the upper surface of the first semiconductor substrate to the lower surface of the second semiconductor substrate. The annealing results in at least one void between the upper surface and the lower surface that includes a layer of diffused metal. The layer of diffused metal extends from a first individual bond pad towards a second individual bond pad and forms an electrical or thermal short. The method then includes exposing the stacked semiconductor device to microwave radiation to excite a chemical constituent present in the void.

20 Claims, 8 Drawing Sheets

(56) References Cited

U.S. PATENT DOCUMENTS

| | | | |
|---|---|---|---|
| 2021/0028135 A1* | 1/2021 | Said | H01L 24/80 |
| 2021/0057373 A1* | 2/2021 | Kim | H01L 24/16 |
| 2021/0134753 A1* | 5/2021 | Lee | H01L 24/05 |
| 2021/0151450 A1 | 5/2021 | Or-Bach et al. | |
| 2021/0193625 A1* | 6/2021 | Katkar | H01L 24/06 |
| 2021/0242152 A1* | 8/2021 | Fountain, Jr. | H01L 24/80 |
| 2021/0320075 A1* | 10/2021 | Hou | H01L 24/05 |
| 2022/0093555 A1* | 3/2022 | Hou | H01L 24/05 |
| 2022/0139867 A1* | 5/2022 | Uzoh | H01L 25/18 |
| | | | 438/107 |
| 2022/0199559 A1* | 6/2022 | Fang | H01L 24/09 |
| 2022/0216167 A1* | 7/2022 | Yang | H01L 24/80 |
| 2022/0336394 A1* | 10/2022 | Ishikawa | H01L 24/06 |
| 2022/0359601 A1* | 11/2022 | Tsai | H01L 23/5226 |
| 2022/0415835 A1* | 12/2022 | Bae | H01L 21/6835 |

\* cited by examiner

SYSTEMS AND METHODS FOR DIRECT BONDING IN SEMICONDUCTOR DIE MANUFACTURING

TECHNICAL FIELD

The present disclosure is generally related to systems and methods for directly bonding semiconductor materials. In particular, the present technology relates to methods for improving the electrical and thermal performance of semiconductor devices having directly bonded materials.

BACKGROUND

Individual semiconductor dies are typically manufactured in bulk on a semiconductor wafer then separated into individual semiconductor dies. The bulk manufacturing process can increase throughput and reduce difficulties in handling individual semiconductor dies as they continue to shrink in size. Individual semiconductor dies can then be stacked to form semiconductor assemblies. Hybrid bonding, sometimes called fusion bonding or direct bonding, describes a bonding process without any additional intermediate layers between the dies. Hybrid bonding processes rely on chemical bonds and interactions between two surfaces. For example, a hybrid bonding process for silicon is based on intermolecular interactions including van der Waals forces, hydrogen bonds, and strong covalent bonds. The direct bond between surfaces helps allow semiconductor die manufacturers meet demands for reduction in the volume occupied by stacked die assemblies. However, hybrid bonding processes typically require extremely clean surfaces to avoid the creation of voids between surfaces. The voids can cause defects in the stacked die assembly, for example where a layer of metal drifts into the void to form electrical and thermal shorts between conductive elements on the bonded surfaces. The resulting shorts can cause the stacked assembly to fail to meet performance demands, resulting in the stacked die assembly being thrown out and a reduction in throughput.

Figure 1A:
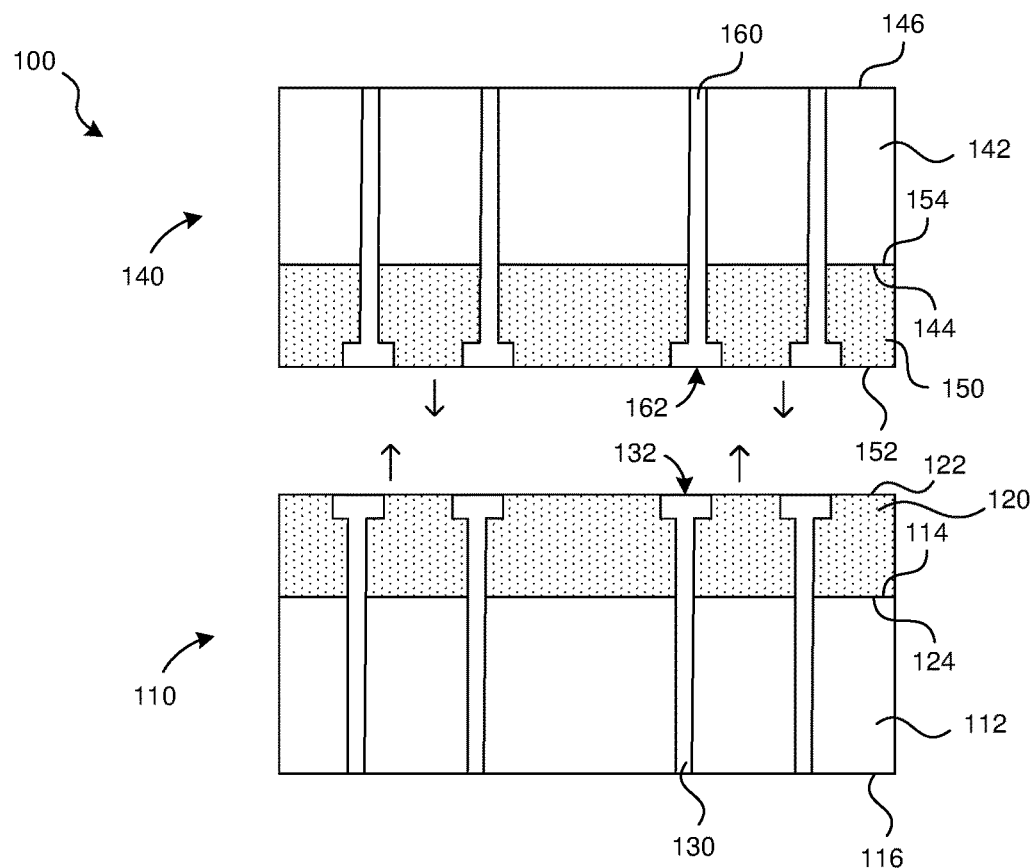
FIGS. 1A and 1B illustrate a hybrid bonding process between two semiconductor dies in accordance with some embodiments of the present technology.

The drawings have not necessarily been drawn to scale. Similarly, some components and/or operations can be separated into different blocks or combined into a single block for the purpose of discussion of some of the implementations of the present technology. Moreover, while the technology is amenable to various modifications and alternative forms, specific implementations have been shown by way of example in the drawings and are described in detail below. The intention, however, is not to limit the technology to the particular implementations described. On the contrary, the technology is intended to cover all modifications, equivalents, and alternatives falling within the scope of the technology as defined by the appended claims.

DETAILED DESCRIPTION

Overview

Stacked semiconductor assemblies, and systems and methods for their manufacture, are disclosed herein. In some embodiments, the stacked semiconductor assembly includes a first semiconductor die having a semiconductor substrate with a first bonding surface and one or more first conductive features positioned on the first bonding surface (e.g., bond pads, exposed interconnects, thermal transfer units, and/or various other conductive features). A second semiconductor die is stacked on the first die. The second die includes a semiconductor substrate with a second bonding surface contacting the first bonding surface of the first semiconductor substrate and one or more second conductive features positioned on the second bonding surface. In some embodiments, the second bonding surface directly contacts the first bonding surface of the first semiconductor substrate. Further, each of the one or more second conductive features can be electrically coupled to a corresponding first conductive feature at an interface between the bonding surfaces. The stacked semiconductor assembly also includes a void at the bonding interface for the first and second bonding surfaces and laterally between pairs of first and second conductive features. Further, the void can include a layer of diffused and oxidized metal extending from at least one of the first conductive features. As a result of the manufacturing process, the diffused and oxidized metal is electrically nonconductive.

In some embodiments, a method for bonding layers in the stacked semiconductor includes aligning a first array of conductive features on the first bonding surface of the first semiconductor substrate with a second array of conductive features on the second bonding surface of the second semiconductor substrate. Once aligned, the method includes annealing the stacked semiconductor dies to directly bond the first bonding surface to the second bonding surface. The alignment and/or annealing process can result in at least one void forming between the upper surface and the lower surface, and the void can include a layer of metal material. The layer of metal material can be the result of, for example, metallic drift when forming the first array of conductive features, aligning the first and second arrays, and/or annealing the stacked semiconductor dies. In some embodiments, the layer of metal material extends from a first individual conductive feature in the first array towards a second individual conductive feature in the first array. In some embodiments, the layer of metal material extends entirely from the first individual conductive feature to the second individual conductive feature, thereby forming an electrical and/or thermal short between the conductive features.

Once the first and second semiconductor substrates are bonded, the method includes exposing the stacked semiconductor device to microwave radiation to excite a chemical constituent present in the void. The excited chemical constituent reacts with the layer of metal material in the void to reduce the electrical and/or thermal conductivity of the metal. In some embodiments, for example, the chemical constituent is a hydroxy group molecule (e.g., doped into the first and/or second bonding surface, in gaseous form in the void, etc.). In these embodiments, the microwave radiation excites the hydroxy group molecule, which then reacts with the layer of metal material to oxidize the metal.

For ease of reference, a stacked semiconductor assembly is sometimes described herein with reference to top and bottom, upper and lower, upwards and downwards, and/or horizontal plane, x-y plane, vertical, or z-direction relative to the spatial orientation of the embodiments shown in the figures. It is to be understood, however, that the stacked semiconductor assembly, and the surfaces bonded therein, can be moved to, and used in, different spatial orientations without changing the structure and/or function of the disclosed embodiments of the present technology.

Further, although primarily discussed herein in the context of bonding two semiconductor dies together, one of skill in the art will understand that the scope of the invention is not so limited. For example, the method can be used in bonding any two surfaces in a semiconductor assembly, bonding two semiconductor assemblies together, bonding surfaces within an individual semiconductor die, and/or bonding surfaces with similar materials. Accordingly, the scope of the invention is not confined to any subset of embodiments and is confined only by the limitations set out in the appended claims.

DESCRIPTION OF THE FIGURES

Figure 1B:
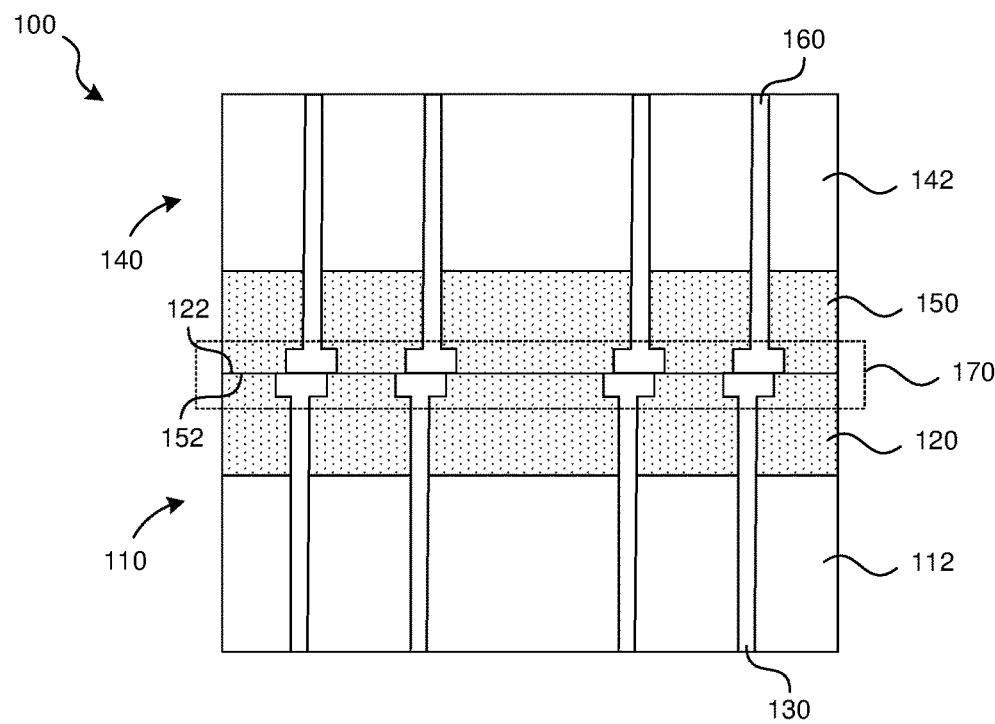

FIGS. 1A and 1B illustrate a hybrid bonding process between two semiconductor dies in a stacked semiconductor assembly 100 ("stacked assembly 100") in accordance with some embodiments of the present technology. As illustrated with reference to FIG. 1A, in some embodiments, the hybrid bonding process can occur between a first semiconductor die 110 ("first die 110") and a second semiconductor die 140 ("second die 140").

The first die 110 includes a semiconductor substrate 112 that has a first surface 114 (e.g., an upper surface) and a second surface 116 (e.g., a lower surface) opposite the first surface 114. A material 120 is deposited on the first surface 114 with a bonding surface 122 facing outwardly (e.g., upwardly) from the substrate 112. The material 120 insulates the first die 110 and facilitates bonding the first die 110 to the second die 140. The material 120 can be a dielectric material, a polymer material, and/or various other suitable materials. Examples of dielectrics that can be used include silicon dioxide, silicon nitride, silicon oxynitride, silicon carbon nitride, polysilicon, silicon carbonate, and/or any other suitable dielectric. Examples of polymers include polypyrrole, polyaniline, polydopamine, and/or various suitable epoxy resins.

As further illustrated in FIG. 1A, the first die includes interconnect structures 130 extending from the bonding surface 122 of the material 120 towards the second surface 116 of the substrate 112. In some embodiments, the interconnect structures 130 extend fully from the bonding surface 122 to the second surface 116. In other embodiments, the interconnect structures 130 extend from the bonding surface 122 to the first surface 114 of the substrate 112 and/or to some intermediate depth between the bonding surface 122 and the second surface 116 (e.g., to the first surface 114, to a depth in the substrate 112, etc.). Further, each individual interconnect structure 130 includes a bond site 132 at the bonding surface 122. As illustrated, each bond site 132 is generally flush with the bonding surface 122 of the material 120, thereby providing a generally flat surface for bonding with the second die 140.

In the illustrated embodiment, each bond site 132 is illustrated with a bond pad shape, having a wider diameter than the remainder of the corresponding interconnect structure 130. The larger diameter of the bond site 132 can help facilitate bonding to a corresponding electrical feature in the second die 140 (e.g., as discussed below, a corresponding interconnect structure 160). In some embodiments, each bond site 132 can have a different size and/or shape. For example, in various embodiments, the bond sites 132 can have a diameter generally corresponding to the diameter of the interconnect structure 130, varying diameters (e.g., based on the location on the first die 110), and/or can have varying shapes when viewed from above. In some embodiments, each bond site 132 can be an exposed portion of the interconnect structure 130 at the bonding surface 122.

In some embodiments, the interconnect structures 130 can be made from copper, nickel, tungsten, cobalt, indium, tin, ruthenium, molybdenum, bismuth, aluminum, polysilicon and/or polycide (e.g., tungsten silicon, molybdenum silicon, nickel silicon, etc.), conductor-filled epoxy, and/or other suitable electrically conductive materials. In some embodiments, the interconnect structures 130 can be surrounded by an insulator to electrically isolate the interconnect structures 130 from the substrate 112. In some embodiments, the bond sites 132 can also be made from copper, nickel, tungsten, cobalt, indium, tin, ruthenium, molybdenum, bismuth, aluminum, polysilicon and/or polycide (e.g., tungsten silicon, molybdenum silicon, nickel silicon, etc.), conductor-filled epoxy, and/or other suitable electrically conductive materials. In some embodiments, the interconnect structures 130 and the bond sites 132 can be made from the same material (e.g., when a bond site is a continuation of the interconnect structure). For example, the interconnect structures 130 and the bond sites 132 can both be made from copper. In some such embodiments, the interconnect structures 130 and the bond sites 132 can be formed in a single step. In other embodiments, they can be formed in separate steps. In some embodiments, the interconnect structures 130 and the bond sites 132 can be made from differing materials. For example, the interconnect structures 130 can be made from nickel while the bond sites 132 can be made from copper.

Similar to above, the second die 140 includes a semiconductor substrate 142 that has a first surface 144 (e.g., a lower surface) and a second surface 146 (e.g., an upper surface) opposite the first surface 144. A material 150 is deposited on the first surface 144 with a bonding surface 152 facing outwardly from the substrate 142. The material 150 insulates the second die 140 and facilitates bonding the second die 140 to the first die 110. The material 150 can correspond to the material 120, such as a corresponding dielectric, a corresponding polymer, and/or various other suitable materials.

The second die also includes interconnect structures 160 extending from the bonding surface 152 of the material 150 towards the second surface 146 of the substrate 142. In some embodiments, the interconnect structures 160 extend fully from the bonding surface 152 to the second surface 146. In other embodiments, the interconnect structures 160 extend from the bonding surface 152 to some intermediate depth (e.g., to the first surface 144, to a depth in the material 150, to a depth in the substrate 142, etc.). Further, each individual interconnect structure 160 includes a bond site 162 at the bonding surface 152. As illustrated, each bond site 162 is generally flush with the bonding surface 152 of the material 150, thereby providing a generally flat surface for bonding with the first die 110. In various embodiments, each bond site 162 can have a diameter generally corresponding to the diameter of the interconnect structure 160, varying diameters (e.g., based on the location on the second die 140), can be an exposed portion of the interconnect structure 160 at the bonding surface 152, and/or can have varying shapes when viewed from above.

Further, in various embodiments, the interconnect structures 160 and/or bond sites 162 can be made from copper, nickel, conductor-filled epoxy, and/or other electrically conductive materials. In some embodiments, the interconnect structures 160 can be surrounded by an insulator to electrically isolate the interconnect structures 160 from the substrate 142. In some embodiments, the interconnect structures 160 and the bond sites 162 can be made from the same material (e.g., when a bond site is a continuation of the interconnect structure). In some embodiments, the interconnect structures 160 and the bond sites 162 can be made from differing materials.

As illustrated by arrows in FIG. 1B, the hybrid bonding process includes stacking the second die 140 on the first die 110 to form the stacked assembly 100. Within the stacked assembly 100, as illustrated in FIG. 1B, the material 120 of the first die 110 is in direct contact with the material 150 from the second die 140 at a bonding interface 170. In a typical hybrid bonding process, the stacked assembly 100 is then heated and put under pressure to join the material 120 to the material 150 at the bonding interface 170. However, each of the bonding surfaces 122, 152 can include various impurities (e.g., particles, organic contamination, ionic contamination, etc.) resulting from previous manufacturing steps and/or movement during manufacturing. The impurities can result in voids forming at the bonding interface 170. The voids can reduce the strength of the bond between the first and second dies 110, 140. Further, as discussed in more detail below with respect to FIGS. 2A and 2B, metal adjacent the voids can drift into the void, which can result in an electrical or thermal short between corresponding bond pads adjacent the void. Accordingly, in a typical hybrid bonding process, each of the bonding surfaces 122, 152 is meticulously cleaned prior to stacking to reduce the impurities present at the bonding interface 170. However, even with extensive cleaning, one or more voids can still form at the bonding interface 170, thereby creating a risk of shorts between bond pads.

Figure 2A:
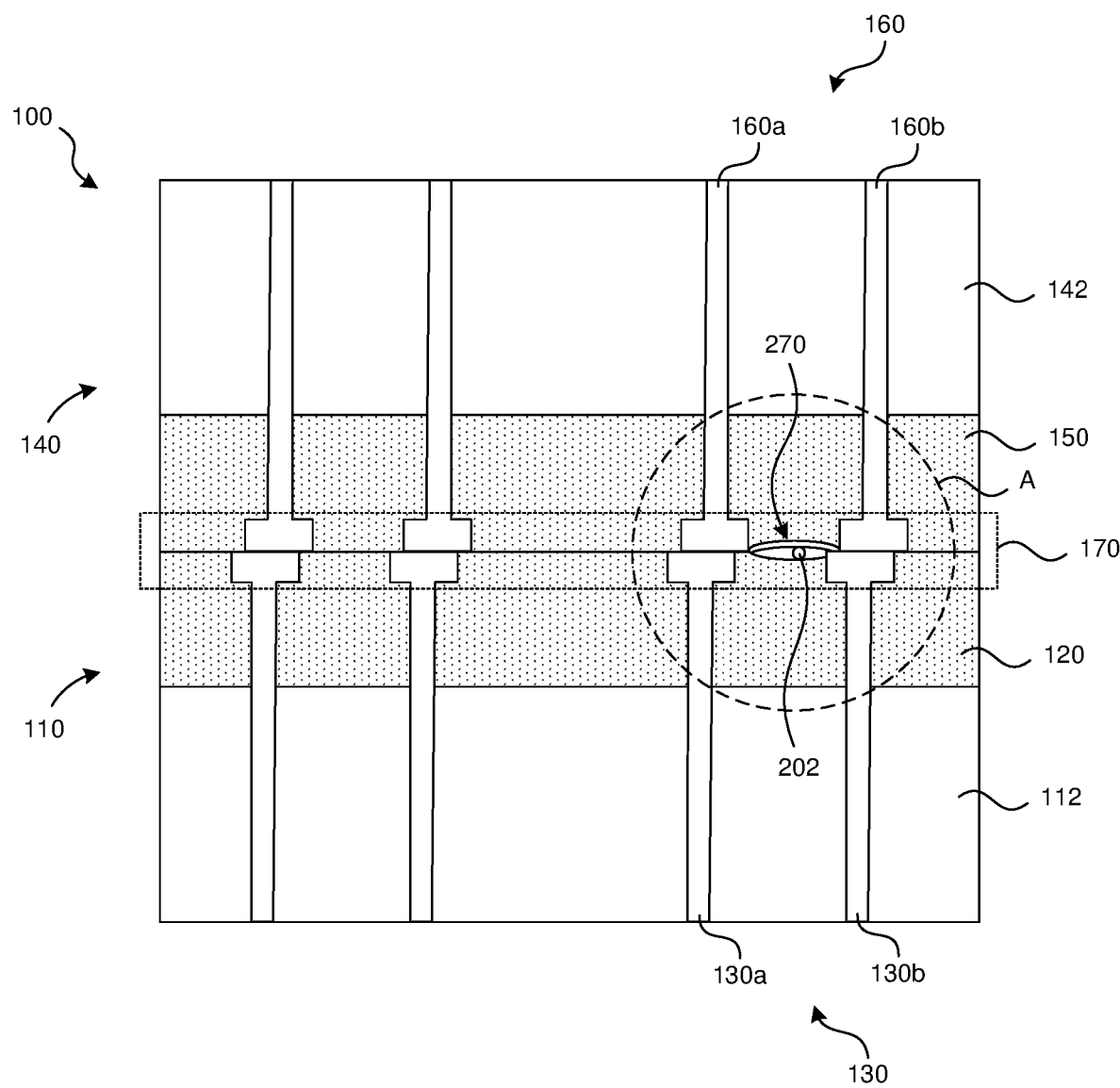
FIG. 2A is a cross-sectional view of a stacked semiconductor assembly with a void in accordance with some embodiments of the present technology.

FIG. 2A is a cross-sectional view of a stacked assembly 100 with a void 270 in accordance with some embodiments of the present technology. In the illustrated embodiment, the second die 140 is stacked on the first die 110 and the material 150 is bonded with the material 120 at the bonding interface 170. Further, individual interconnect structures 160a, 160b are generally aligned with corresponding individual interconnect structures 130a, 130b, thereby forming electrical and/or thermal connections between the first and second dies 110, 140. In some embodiments, the hybrid bonding process applied to the bonding surfaces 122, 152 (FIG. 1A) can anneal corresponding individual interconnect structures 130a, 160a and 130b, 160b at the bonding interface 170, thereby forming an integral bond between the corresponding individual interconnect structures 130a, 160a and 130b, 160b. In some embodiments, the stacked assembly 100 can be further annealed after the bonding surfaces 122, 152 are bonded.

As further illustrated in FIG. 2A, however, a particle 202 was leftover at the bonding interface 170 after cleaning and alignment. When the first and second dies 110, 140 were bonded together, the particle 202 caused the void 270 to form at the bonding surface. In turn, as illustrated in more detail in FIG. 2B, the void 270 can allow metal from the bond sites 132, 162 and/or the interconnect structures 130, 160 to drift in the void 270.

Figure 2B:
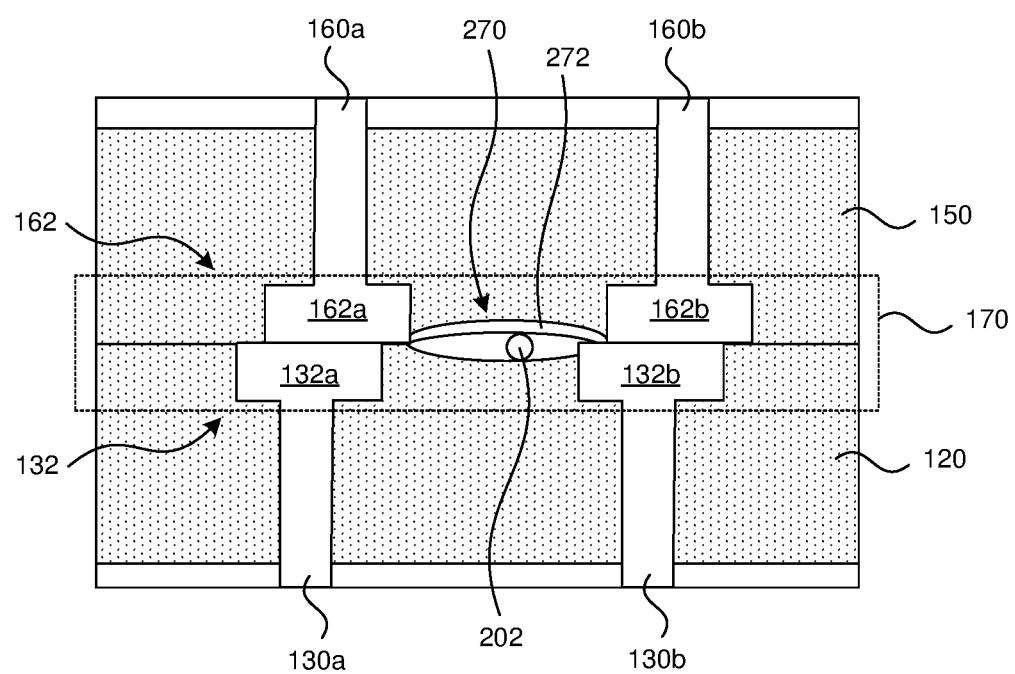
FIG. 2B is an enlarged cross-sectional view of the void of FIG. 2A in accordance with some embodiments of the present technology.

FIG. 2B is an enlarged cross-sectional view of the void 270 from region A of FIG. 2A in accordance with some embodiments of the present technology. As discussed above, the void 270 results from a particle 202 between the materials 120, 150 during the bonding process. As further illustrated in FIG. 2B, a layer of metal material 272 is present in the void 270. In some embodiments, the metal material 272 is the result of surface diffusion from one or more of the bond sites 132, 162 during the hybrid bonding process. For example, as the stacked assembly 100 is pressurized and heated, the metal material 272 can drift into the open surface area in the void 270. In embodiments having an additional annealing process for the bond sites 132, 162, the metal material 272 can additionally, or alternatively, diffuse into the void 270 during the addition annealing process.

In the illustrated embodiment, the metal material 272 extends from an individual bond site 162a to an individual bond site 162b. As a result, the metal material 272 forms an electrical and/or thermal short between the individual bond site 162a and the individual bond site 162b. As a result, the metal material 272 forms an electrical and/or thermal short between the corresponding individual interconnect structures 130a, 160a and the corresponding individual interconnect structures 130b, 160b, thereby reducing the electrical and/or thermal performance of the stacked assembly 100. If enough similar voids form elsewhere at the bonding interface 170 with similar layers of metal material drifting through them, the voids can reduce the electrical and/or thermal performance of the stacked assembly 100 beyond an acceptable threshold. That is, some embodiments, completed stacked assemblies is tested after bonding to measure the electrical and/or thermal performance of the stacked assemblies. A stacked assembly with too many shorts between interconnect structures will fail to meet performance standards due to the electrical and/or thermal shorts. In some embodiments, for example, the shorts can cause the stacked assembly to have too few functional electrical paths. In some embodiments, the shorts can cause heat to be too mobile through the stacked assembly. In a typical manufacturing process, stacked assemblies that fail to meet performance standards are thrown out, thereby reducing the throughput of the process.

Although discussed primarily herein as causing shorts between interconnect structures, the voids can cause shorts between other conductive structures at the bonding interface. For example, in some embodiments, the materials 120, 150 can include one or more conductive structures that facilitate bonding between the first and second dies 110, 140, provide designated thermal pathways at the bonding interface 170, and/or provide various other suitable functions. A similar void at the bonding interface can also disrupt these functions. For example, a metal material can form a short between conductive structures providing a designated thermal pathway, thereby shorting the pathway; and/or a metal material can form a short between a conductive structure in the thermal pathway and the interconnect structure, thereby introducing an unintended thermal pathway. These shorts can also cause a completed stacked assembly to fail to meet performance standards and, in a typical hybrid bonding process, be thrown out.

As discussed above, the hybrid bonding process can include one or more cleaning steps before the first and second dies 110, 140 are stacked. By cleaning the surfaces, the process can reduce the number of particles that can form voids at the bonding interface, thereby reducing the number of shorts caused by a metal material that drifts into in the voids. However, the cleaning process can be expensive and often cannot fully clean the bonding surfaces to fully remove the chance of shorts forming. In some embodiments, the hybrid bonding process can alternatively, or additionally, include exposing the stacked assembly 100 to radiation (e.g., microwave radiation) after bonding the bonding surfaces. The electromagnetic radiation ("radiation") can be used to corrode the metal material in any voids to reduce the number of shorts on the backend of the hybrid bonding process. Additional details on such embodiments are described with respect to FIGS. 3-5 below.

Figure 3:
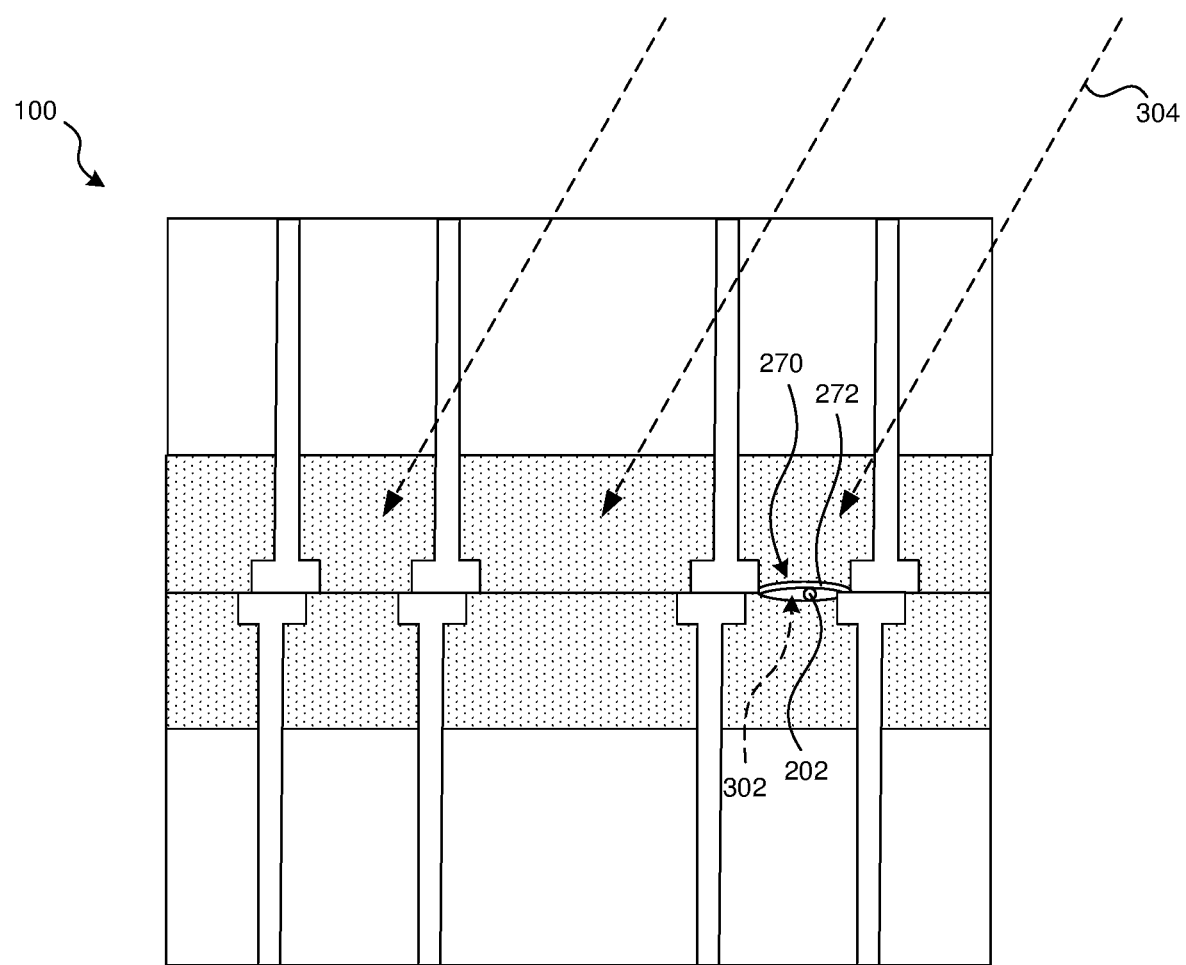
FIG. 3 is a cross-sectional view of a stacked semiconductor assembly exposed to radiation in accordance with some embodiments of the present technology.

FIG. 3 is a cross-sectional view of the stacked assembly 100 of FIG. 2A exposed to electromagnetic radiation 304 ("radiation 304") in accordance with some embodiments of the present technology. The radiation 304 excites a chemical constituent 302 present in the void 270. The excited chemical constituent 302 then reacts with the metal material 272 in the void 270 to degrade (e.g., oxidize, corrode, consume, and/or deteriorate) the metal material 272. As a result of the reaction, the electrical and/or thermal conductivity of the metal material 272 can be reduced (or destroyed), thereby reducing and/or removing the shorts caused by the metal material 272. For example, in some embodiments, the chemical constituent 302 can be a hydroxy group molecule. The radiation 304 excites the hydroxy group molecule, which the reacts with the metal material 272 in the void 270 to oxidize the metal material 272. In some embodiments, the chemical constituent 302 is a gas present in the void 270. For example, the chemical constituent 302 can be atmospheric air containing dihydrogen oxide molecules. In some embodiments, the radiation 304 is microwave radiation having a frequency between about 100 megahertz (MHz) and about 3000 MHz, between 500 MHz and about 2750 MHz, or between about 900 MHz and about 2450 MHz.

In some embodiments, the chemical constituent 302 is more quickly excited by the radiation 304 than the other materials in the stacked assembly 100. Accordingly, the radiation 304 can cause the reaction between the excited chemical constituent 302 and the metal material 272 before any of the other components of the stacked assembly 100 are detrimentally affected by the radiation 304. Accordingly, in some embodiments, the hybrid bonding process can target the entire stacked assembly 100 with the radiation 304 to address the shorts in multiple voids (not shown) at once. For example, the stacked assembly can include three or more stacked semiconductor dies (not shown) directly bonded to each other, with one or more voids formed at each interface. The hybrid bonding process can include exposing the entire stacked assembly to the radiation 304 at once. In other embodiments, the hybrid bonding process can target the radiation 304 at one or more specific voids in the stacked assembly 100. For example, in some embodiments, the hybrid bonding process can include testing the stacked assembly 100 after bonding to identify one or more shorts, then targeting the shorts with the radiation 304. In some embodiments, the hybrid bonding process can include multiple iterations of stacking a semiconductor die on another, bonding the dies, exposing the bonded dies to the radiation 304, then stacking another die on the bonded stack and repeating. By exposing the stack to radiation 304 at each iteration of stacking, the hybrid bonding process can help ensure the radiation 304 reaches any newly formed voids.

Further, in some embodiments, the hybrid bonding process can include iterations of the radiation exposure depicted in FIG. 3. For example, the hybrid bonding process can include testing the stacked assembly 100 after the radiation 304 and/or any resulting reactions. If the stacked assembly 100 contains more shorts than acceptable, the hybrid bonding process can include re-exposing the stacked assembly 100 to the radiation 304. Similar to above, the re-exposure to the radiation 304 re-excites the chemical constituent 302, which then further reacts with the metal material 272 to further degrade the metal material 272. In some embodiments, the iterations of radiation exposure can continue until the stacked assembly 100 contains an acceptable number of shorts. In some embodiments, the iterations of radiation exposure can continue until all of the shorts are removed from the stacked assembly 100. In some embodiments, iterations of radiation exposure can continue for a predetermined maximum number of iterations. If the stacked assembly 100 still contains more shorts than acceptable after the maximum iterations, the hybrid bonding process can include disposing the stacked assembly 100.

Figure 4A:
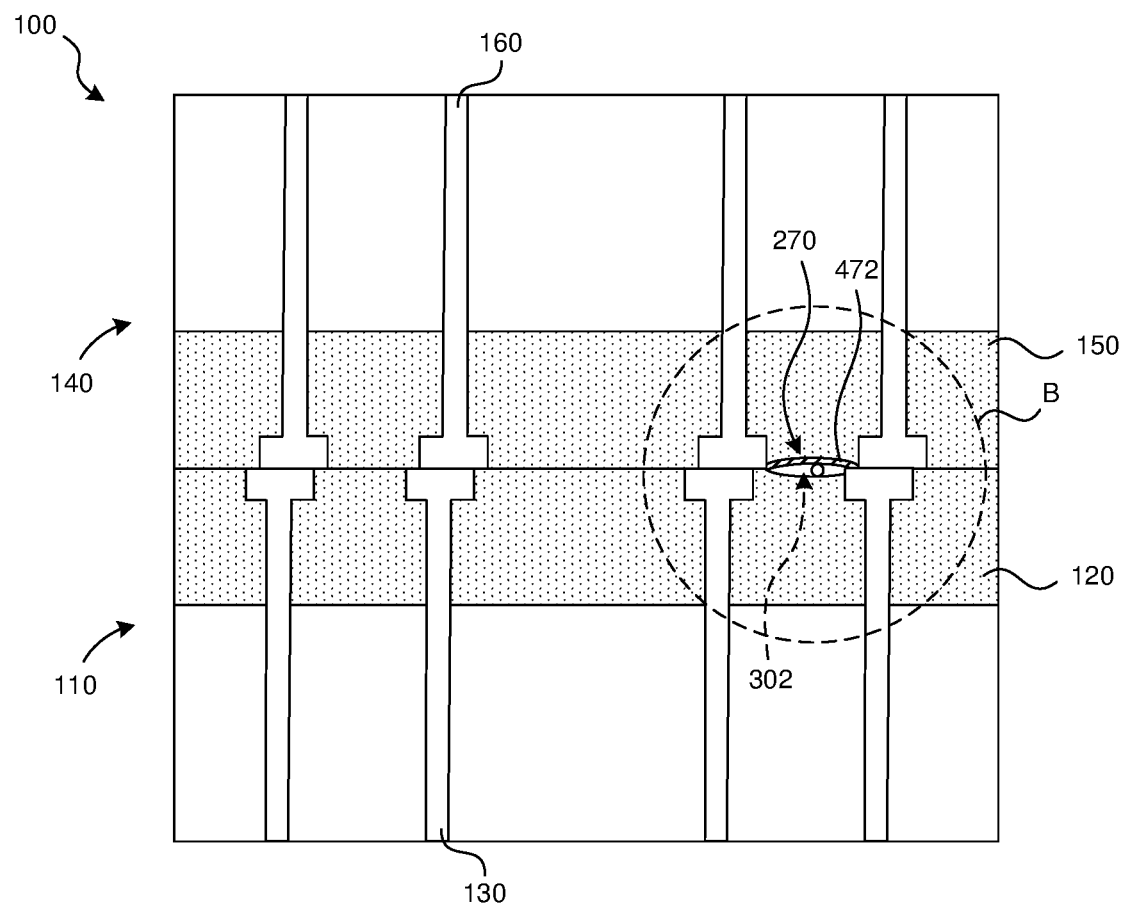
FIG. 4A is a cross-sectional view of a stacked semiconductor assembly with a void after being exposed to radiation in accordance with some embodiments of the present technology.
Figure 4B:
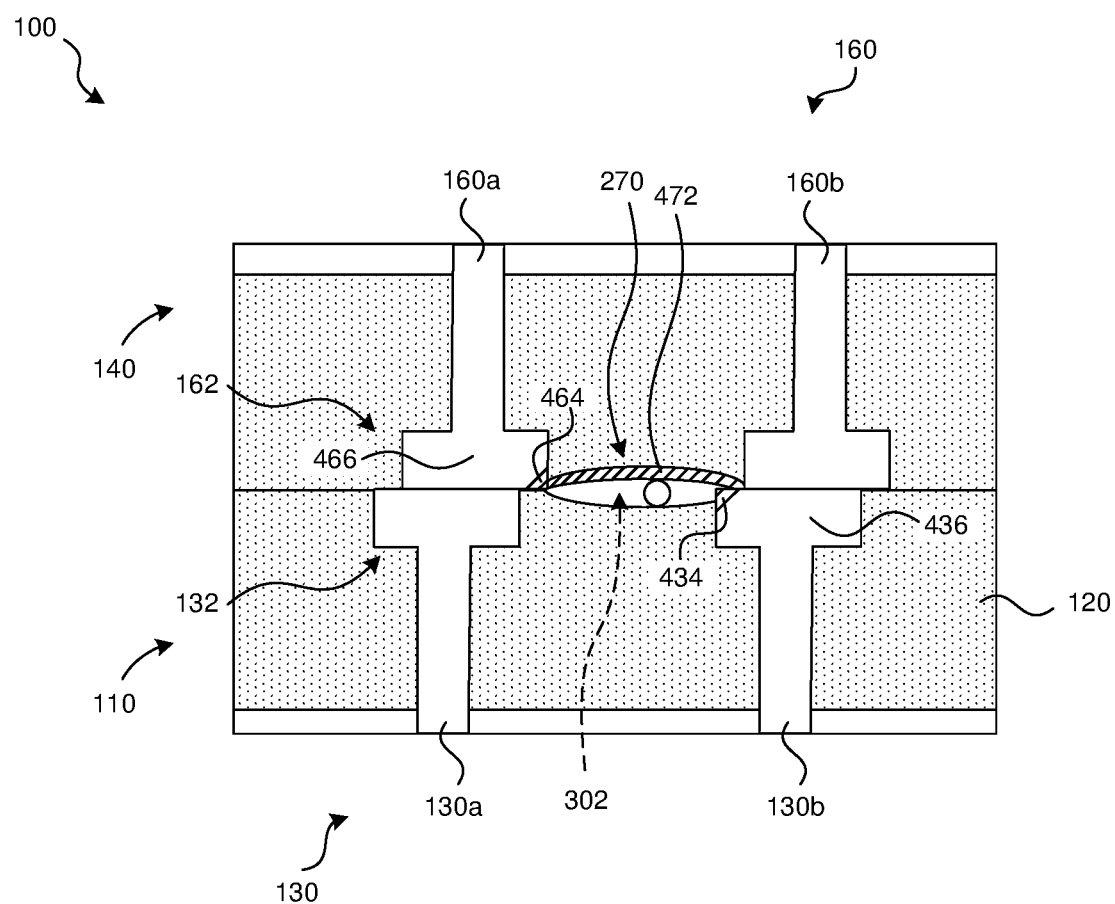
FIG. 4B is an enlarged cross-sectional view of the void of FIG. 4A in accordance with some embodiments of the present technology.

FIGS. 4A and 4B are a cross-sectional view of the stacked assembly 100 after being exposed to electromagnetic radiation in accordance with some embodiments of the present technology. As illustrated with respect to FIG. 4A, the components of the stacked assembly 100 were generally unaffected by the radiation and subsequent reaction. For example, the first and second dies 110, 140 remain bonded by the materials 120, 150, and the interconnect structures 130 in the first die 110 remain bonded to corresponding interconnect structures 160 in the second die 140. However, as further illustrated in FIG. 4A, the materials in the void 270 have been affected by the reaction between the chemical constituent 302 and the metal material 472. FIG. 4B is an enlarged cross-sectional view of the region B of FIG. 4A.

As illustrated with respect to FIG. 4B, the components of the stacked assembly 100 are only affected where exposed to the chemical constituent 302 in the void 270. For example, the metal material 472 is now fully degraded (e.g., oxidized, corroded, consumed, and/or deteriorated) because the metal material 272 (FIG. 3) was fully exposed to the chemical constituent 302 in the void 270. Further, in the illustrated embodiment, an edge portion 434 of one of the bond sites 132 adjacent the void 270 was degraded because the edge portion 434 was exposed to the chemical constituent 302, while a central portion 436 was generally unaffected because the central portion 436 was not exposed. Similarly, an edge portion 464 of one of the bond sites 162 adjacent the void 270 was degraded while a central portion 466 was generally unaffected. In some embodiments, the edge portions 434, 464 of the bond pads 132, 162 exposed to the chemical constituent 302 in the void 270 can be sufficiently small to not react with the chemical constituent 302 to degrade. In some embodiments, the metal extending away from an edge portion and into the void shelters the edge portion from the chemical constituent 302. Accordingly, in these embodiments, the bond pads 132, 162 are generally unaffected by the exposure to the radiation.

The degraded metal material 472 (as well as the degraded edge portions 434, 464) are less conductive after the reaction. In some embodiments, the degraded metal material 472 does not conduct electricity at all and/or has a very low thermal conduction. That is, the degraded metal material 472 is generally unable to provide an electrical and/or thermal short between the corresponding individual interconnect structures 130a, 160a and the corresponding individual interconnect structures 130b, 160b. As a result, the stacked assembly 100 can have an improved electrical and/or thermal performance after the exposure to the radiation compared to the stacked assembly's performance before. The improvement in performance can move some stacked assemblies from below a predefined standard for performance to at or above the predefined standard, thereby reducing the number of stacked assemblies that are thrown out at the end of the hybrid bonding process.

Figure 5:
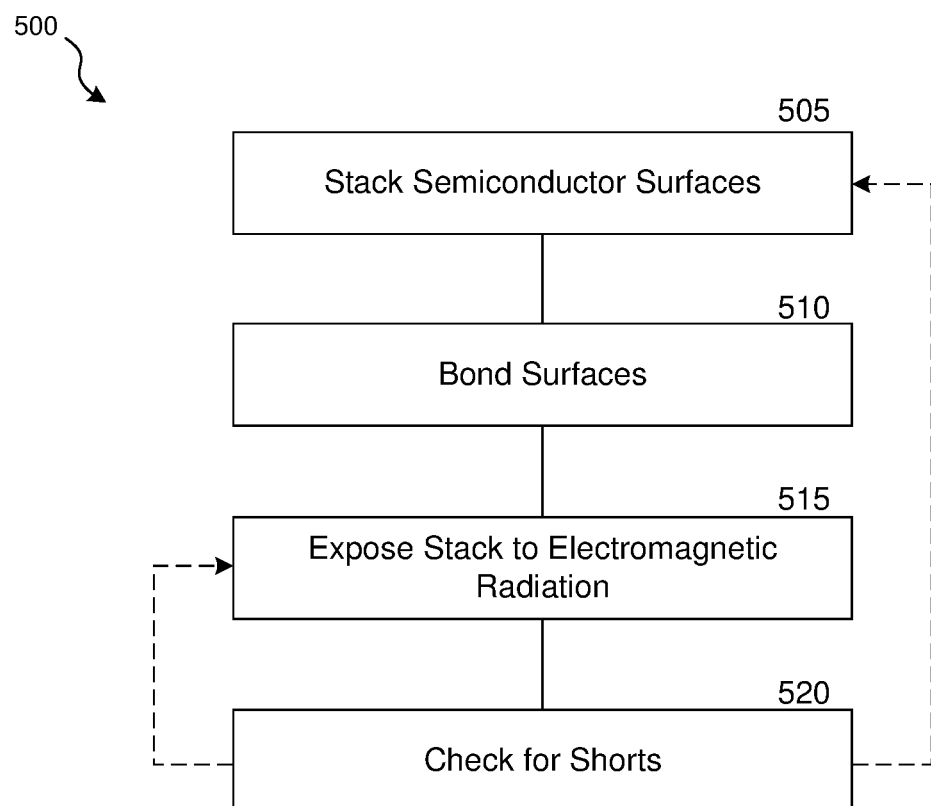
FIG. 5 is a flow diagram of a process for producing a stacked semiconductor assembly in accordance with some embodiments of the present technology.

FIG. 5 is a flow diagram of a generalized process 500 ("process 500") for bonding semiconductor materials in accordance with some embodiments of the present technology. As described above, the process 500 can bond two or more semiconductor dies in a stacked assembly. Further, in various embodiments, the process 500 can bond any two surfaces in a semiconductor assembly and/or using semiconductor materials (e.g., two or more semiconductor assemblies, two or more bonding surfaces within an individual semiconductor die, and/or two or more bonding surfaces with similar materials).

At block 505 the process 500 includes stacking at least two semiconductor materials with bonding surfaces of the semiconductor materials in contact with each other. For example, in some embodiments, the process 500 includes stacking a first semiconductor die onto a second semiconductor die with bonding surfaces of the semiconductor dies in direct contact with each other. In some embodiments, the process 500 includes stacking multiple semiconductor materials with bonding surfaces of the semiconductor materials in direct contact with each other. For example, the process 500 can include stacking three or more semiconductor dies directly on top of each other at block 505.

In some embodiments, the process 500 includes a cleaning phase at block 505 to reduce the number of impurities present at a bonding interface between the semiconductor materials. As discussed above, the cleaning phase can reduce the number of voids that are formed during the process 500. In some embodiments, the process 500 includes a doping phase at block 505 to introduce a desired chemical constituent between the semiconductor materials to react with materials in any voids that do form during the process 500. In some embodiments, the doping phase at block 505 introduces the chemical constituent into the ambient air around the semiconductor materials. In some embodiments, the doping phase includes doping the bonding surface of the semiconductor materials with the chemical constituent.

Further, in some embodiments, the process 500 includes an alignment phase at block 505 to ensure proper alignment of components in the semiconductor materials. For example, the alignment phase can include aligning a first plurality of conductive features (e.g., metallic bond sites) on the bonding surface of a first semiconductor die with a second plurality of conductive features on the bonding surface of a second semiconductor die.

At block 510 the process 500 includes bonding the stacked semiconductor surfaces through a hybrid bonding process. As discussed above, the hybrid bonding process of block 510 can include heating and/or pressurizing the stacked semiconductor materials. As a result, the bonding surfaces directly bond together while the aligned conductive features bond together to form electrical and/or thermal connections between the semiconductor materials.

During the bonding process at block 510, impurities at the bonding surfaces can cause one or more voids to form between the semiconductor materials. In embodiments that included a doping phase at block 505, the voids will include the chemical constituent. In some embodiments, the presence of the chemical constituent in the ambient air around the stacked semiconductor results in the voids including the chemical constituent. In some embodiments, the bonding process at block 510 can include introducing, or maintaining, the chemical constituent in the ambient air. As a result, if any voids form between the stacked semiconductor surfaces, they will include the chemical constituent.

At block 515 the process 500 includes exposing the stacked structure to electromagnetic radiation. The electromagnetic radiation excites the chemical constituent in any voids between the stacked semiconductor surfaces. The excited chemical constituent can react metals to thereby degrade the metals present in the void. For example, the chemical constituent can react with metals present in the void to oxidize, corrode, and/or otherwise deteriorate the metal. As a result, metal layers that may have otherwise created an electrical and/or thermal short between conductive features can be degraded beyond being able to create the short.

In some embodiments, the electromagnetic radiation can be microwave radiation with a frequency of between about 900 MHz and about 2450 MHz. In some embodiments, the chemical constituent can be specifically selected based on the chemical constituent's ability to be quickly excited by the microwave radiation. For example, the chemical constituent can be a hydroxy group molecule, which are easily excited by microwave radiation to release a reactive molecule with oxygen. The reactive molecule can then oxidize the metal present in the void. Because the hydroxy group molecule is excited and reacts with the metal with relatively low levels of exposure to the microwave radiation, the process 500 is able to degrade the metal in the void without negatively effecting other components in the stacked structure. Further, because the chemical constituent is only present within the void, the metallic structures adjacent the void have only edge portions degraded by a reaction with the excited chemical constituent.

In some embodiments, the radiation process at block 515 exposes the entire stacked structure to the microwave radiation. The broad exposure can address multiple voids between the stacked semiconductor surfaces at once, thereby significantly reducing the number of shorts in a completed device. In some embodiments, the radiation process at block 515 selectively exposes portions of the stacked structure to the microwave radiation. The selective exposures can target known and/or suspected shorts while reducing the risk of damage to any other components in the stacked structure. In some embodiments, for example, the process 500 can include a step before the radiation exposure to check for shorts in the stacked structure, then expose only the known shorts to the microwave radiation. In some embodiments, the location of shorts in the stacked structure can be a recurring phenomenon (e.g., resulting from a step in the bonding process), such that the radiation process can target the recurring location.

At optional block 520 the process 500 includes checking the stacked structure for electrical and/or thermal short circuits. In some embodiments, the testing process can include an overall performance test of the stacked structure. Performance at, or above, a predetermined threshold can indicate that a sufficiently small number of shorts exist in the stacked structure. Performance below the predetermined threshold can indicate that an excessive number of shorts may still exist. In some embodiments, the testing process can include more individualized tests to locate and/or tally the number of shorts. Stacked structures with a total number of shorts beneath a predefined number can be expected to perform at or above the predetermined threshold, while stacked structures with a total number of shorts above the predefined number can be expected to perform below the predetermined threshold.

In some embodiments, stacked structures performing (or expected to perform) above the predetermined threshold continue in the manufacturing process while stacked structures performing (or expected to perform) below the predetermined threshold are thrown out. In some embodiments, the process can return to block 515 for stacked structures performing (or expected to perform) below the predetermined threshold to re-expose the stacked structures to the electromagnetic radiation. The second exposure can continue a reaction between the chemical constituent and the metal present in a void to further degrade the metal. As a result, one or more shorts that previously survived the previous exposure can be removed, such that when the process returns to block 520, the stacked assembly performs (or is expected to perform) above the predetermined threshold.

In some embodiments, the iteration between blocks 515 and 520 can be repeated until all the shorts in the stacked structure are removed. In some embodiments, the iteration between blocks 515 and 520 can be repeated until an acceptable number of shorts are detected. In some embodiments, the iteration between blocks 515 and 520 can include a predetermined maximum iterations. If the shorts are not removed (or not reduced to an acceptable level) before the predetermined maximum iterations, the process 500 can dispose of the stacked structure and end.

In some embodiments, the process 500 can be repeated for each layer of a stacked assembly. For example, in some embodiments, the process includes stacking first and second semiconductor dies at block 505 in a stacked assembly, bonding the surfaces of the dies at 510, exposing the stacked assembly to electromagnetic radiation at block 515, testing the stacked assembly at block 520, then returning to block 505 to add another semiconductor die to the stacked assembly. In some embodiments, the process 500 can be repeated while adding multiple layers of semiconductor materials (e.g., stacking two, three, five, ten, or any suitable number of materials) on each pass.

Figure 6:
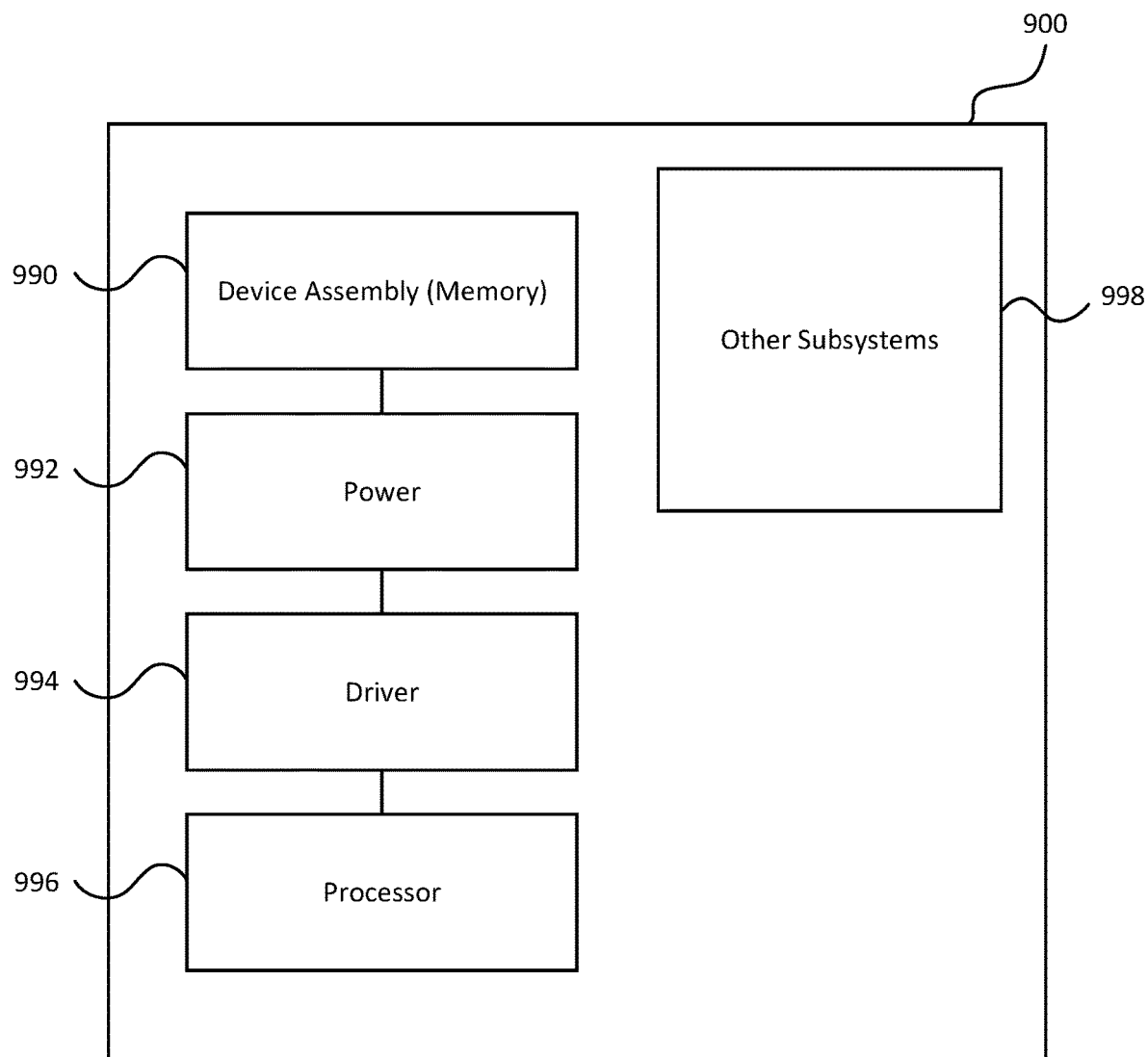
FIG. 6 is a schematic view of a system that includes a semiconductor die assembly configured in accordance with some embodiments of the present technology.

FIG. 6 is a schematic view of a system that includes a semiconductor die assembly configured in accordance with embodiments of the present technology. Any one of the semiconductor devices having the features described above with reference to FIGS. 1A-5 can be incorporated into any of a myriad of larger and/or more complex systems, a representative example of which is system 900 shown schematically in FIG. 6. The system 900 can include a memory 990 substantially as described above (e.g., SRAM, DRAM, flash, and/or other memory devices), a power supply 992, a drive 994, a processor 996, and/or other subsystems or components 998. The semiconductor devices described above with reference to FIGS. 1A-5 can be included in any of the elements shown in FIG. 6. For example, the memory 990 can be include a stack of semiconductor dies bonded in accordance with the process described above with respect to FIG. 5. The resulting system 900 can be configured to perform any of a wide variety of suitable computing, processing, storage, sensing, imaging, and/or other functions. Accordingly, representative examples of the system 900 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 900 include lights, cameras, vehicles, etc. With regard to these and other example, the system 900 can be housed in a single unit or distributed over multiple interconnected units, e.g., through a communication network. The components of the system 900 can accordingly include local and/or remote memory storage devices and any of a wide variety of suitable computer-readable media.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A method for bonding a first semiconductor die to a second semiconductor die to form a stacked semiconductor device, the method comprising:
   aligning a first plurality of metallic bond sites on a first surface of the first semiconductor die with a second plurality of metallic bond sites on a second surface of the second semiconductor die;
   bonding the first surface to the second surface, wherein the first plurality of metallic bond sites is electrically connected to the second plurality of bond sites after the bonding, wherein the bonding leaves at least one void between the first surface and the second surface, and wherein a metal material extends at least partially along an inner surface of the void; and exposing the stacked semiconductor device to radiation to excite a chemical constituent in the void, wherein the excited chemical constituent reacts with the metal material along the inner surface of the void to reduce an electrical conductivity of the metal material.

2. The method of claim 1 wherein the chemical constituent includes a hydroxy group molecule, wherein exposing the stacked semiconductor device to microwave radiation excites the hydroxy group molecule, and wherein the excited hydroxy group molecule reacts with the metal material along the inner surface of the void to oxidize the metal material.

3. The method of claim 1 wherein first plurality of metallic bond sites and the second plurality of bond sites comprise copper.

4. The method of claim 1 wherein the first surface and the second surface comprise a dielectric material.

5. The method of claim 4, wherein the dielectric material is selected from silicon dioxide, silicon nitride, silicon carbon nitride, and silicon carbon oxide.

6. The method of claim 4 wherein the first surface is bonded directly to the second surface by a hybrid bonding process.

7. The method of claim 1 wherein the radiation is microwave radiation having a frequency between 900 megahertz (MHz) and 2450 MHz.

8. A method for bonding layers in a stacked semiconductor device, the method comprising:
aligning a first array of bond pads on an upper surface of a first semiconductor substrate with a second array of bond pads on a lower surface of a second semiconductor substrate;
annealing the stacked semiconductor device to bond the upper surface of the first semiconductor substrate to the lower surface of the second semiconductor substrate, wherein the annealing results in at least one void between the upper surface and the lower surface, wherein the void includes a layer of diffused metal extending from a first individual bond pad from the first array of bond pads towards a second individual bond pad from the first array of bond pads; and
exposing the stacked semiconductor device to microwave radiation to excite a chemical constituent present in the void.

9. The method of claim 8 wherein a particle is positioned between the first semiconductor substrate and the second semiconductor substrate, and wherein the particle causes the void to form during the annealing.

10. The method of claim 8 wherein the excited chemical constituent reacts with the layer of diffused metal in the void to reduce an electrical conductivity of the layer of diffused metal.

11. The method of claim 8 wherein the chemical constituent includes a hydroxy group molecule, wherein exposing the stacked semiconductor device to microwave radiation excites the hydroxy group molecule, and wherein the excited hydroxy group molecule reacts with the layer of diffused metal in the void to oxidize the layer of diffused metal.

12. The method of claim 11 wherein the chemical constituent is atmospheric air and wherein the hydroxy group molecule is dihydrogen oxide.

13. The method of claim 11 wherein the layer of diffused metal in the void includes copper.

14. The method of claim 8, wherein:
the first semiconductor substrate is a first dielectric layer on top of a first semiconductor die;
the second semiconductor substrate is a second dielectric layer on top of a second semiconductor die; and
the annealing bonds the first dielectric layer directly onto the second dielectric layer.

15. A stacked semiconductor device comprising:
a first semiconductor die having a first surface and a second surface opposite the first surface, the first semiconductor die including two first bond pads positioned on the first surface;
a second semiconductor die having a third surface directly contacting the first surface of the first semiconductor die and a fourth surface opposite the third surface, the second semiconductor die including two second bond pads positioned on the third surface, wherein each of the two second bond pads are electrically coupled to a corresponding one of the two first bond pads at two respective interfaces at the third surface; and
a void between the first surface and the third surface and positioned laterally between the two interfaces, wherein the void includes a layer of diffused and oxidized metal extending from at least one of the first bond pads, and wherein the diffused and oxidized metal is electrically non-conductive.

16. The stacked semiconductor device of claim 15 wherein void includes a gas having a hydroxy group compound that can be excited by the microwave process, and wherein the layer of diffused metal is oxidized as a result of a reaction between the layer of diffused metal and the excited hydroxy group compound.

17. The stacked semiconductor device of claim 15 wherein the void further includes gaseous water that can be excited by the microwave process to react with the layer of diffused metal.

18. The stacked semiconductor device of claim 15 wherein the void further is caused by a particle on the third surface of the second semiconductor die when the third surface is bonded to the first surface of the first semiconductor die.

19. The stacked semiconductor device of claim 15 wherein:
the first semiconductor die further includes two first interconnect structures electrically coupled to the two first bond pads and extending towards the second surface; and
the second semiconductor die further includes two second interconnect structures electrically coupled to the two second bond pads and extending towards the fourth surface.

20. The stacked semiconductor device of claim 15 wherein the layer of diffused and oxidized metal is intentionally oxidized by a microwave process after bonding the first semiconductor die to the second semiconductor die.

* * * * *